United States Patent
Feldmann (10) Patent No.: US 9,716,204 B2
(45) Date of Patent: Jul. 25, 2017

(54) METHOD FOR PRODUCING A PHOTOVOLTAIC SOLAR CELL HAVING AT LEAST ONE HETEROJUNCTION PASSIVATED BY MEANS OF HYDROGEN DIFFUSION

(71) Applicant: Fraunhofer-Gesellschaft zur Förderung Der Angewandten Forschung E.V., Munich (DE)

(72) Inventor: Frank Feldmann, Freiburg (DE)

(73) Assignee: Fraunhofer-Gesellschaft Zur Förderung der Angewandten Forschung E.V., München (DE)

( * ) Notice: Subject to any disclaimer, the term of this patent is extended or adjusted under 35 U.S.C. 154(b) by 0 days.

(21) Appl. No.: 15/022,092

(22) PCT Filed: Sep. 22, 2014

(86) PCT No.: PCT/EP2014/070089
§ 371 (c)(1),
(2) Date: Mar. 15, 2016

(87) PCT Pub. No.: WO2015/044070
PCT Pub. Date: Apr. 2, 2015

(65) Prior Publication Data
US 2016/0225938 A1  Aug. 4, 2016

(30) Foreign Application Priority Data

Sep. 27, 2013 (DE) .................. 10 2013 219 561

(51) Int. Cl.
*H01L 21/266* (2006.01)
*H01L 31/18* (2006.01)
(Continued)

(52) U.S. Cl.
CPC ...... *H01L 31/1812* (2013.01); *H01L 21/3003* (2013.01); *H01L 31/02167* (2013.01);
(Continued)

(58) Field of Classification Search
CPC ............. H01L 31/1812; H01L 21/3003; H01L 31/1804; H01L 31/022441;
(Continued)

(56) References Cited

U.S. PATENT DOCUMENTS 7,468,485 B1  12/2008  Swanson
2009/0308438 A1  12/2009  De Ceuster et al.
(Continued)

FOREIGN PATENT DOCUMENTS

DE  102008030693  1/2010
DE  102011001937  10/2012
WO  2012039831  3/2012

*Primary Examiner* — Kyoung Lee
(74) *Attorney, Agent, or Firm* — Volpe and Koenig, P.C.

(57) ABSTRACT

The invention relates to a method for producing a photovoltaic solar cell having at least one hetero-junction, including the following steps: A) providing a semiconductor substrate having base doping; B) producing a hetero-junction on at least one side of the semiconductor substrate, which hetero-junction has a doped hetero-junction layer and a dielectric tunnel layer arranged indirectly or directly between the hetero-junction layer and the semiconductor substrate; C) heating at least the hetero-junction layer in order to improve the electrical quality of the heterojunction. The invention is characterized in that, in a step D after step C, hydrogen is diffused into the hetero-junction layer and/or to the interface between the tunnel layer and the semiconductor substrate.

14 Claims, 5 Drawing Sheets

(51) Int. Cl.
*H01L 31/0216* (2014.01)
*H01L 31/0224* (2006.01)
*H01L 31/0368* (2006.01)
*H01L 31/072* (2012.01)
*H01L 31/0745* (2012.01)
*H01L 31/0747* (2012.01)
*H01L 21/30* (2006.01)

(52) U.S. Cl.
CPC ........ *H01L 31/022425* (2013.01); *H01L 31/022441* (2013.01); *H01L 31/022466* (2013.01); *H01L 31/03682* (2013.01); *H01L 31/072* (2013.01); *H01L 31/0745* (2013.01); *H01L 31/0747* (2013.01); *H01L 31/1804* (2013.01); *H01L 31/1864* (2013.01); *H01L 31/1868* (2013.01); *H01L 31/1872* (2013.01); *H01L 31/1884* (2013.01); *H01L 21/266* (2013.01); *Y02E 10/546* (2013.01); *Y02E 10/547* (2013.01); *Y02P 70/521* (2015.11)

(58) Field of Classification Search
CPC ......... H01L 31/022466; H01L 31/0368; H01L 31/072; H01L 31/0745; H01L 31/0747; H01L 31/02167; H01L 31/1864; H01L 31/1868; H01L 31/1872; H01L 31/1884
See application file for complete search history.

(56) References Cited

U.S. PATENT DOCUMENTS

| | | |
|---|---|---|
| 2010/0139764 A1 | 6/2010 | Smith |
| 2011/0174374 A1 | 7/2011 | Harder |
| 2012/0055547 A1 | 3/2012 | Schultz-Wittmann et al. |
| 2013/0203210 A1* | 8/2013 | Uto .................... H01L 31/1804 438/96 |
| 2013/0240031 A1 | 9/2013 | Shim et al. |

* cited by examiner

METHOD FOR PRODUCING A PHOTOVOLTAIC SOLAR CELL HAVING AT LEAST ONE HETEROJUNCTION PASSIVATED BY MEANS OF HYDROGEN DIFFUSION

BACKGROUND

A photovoltaic solar cell represents a planar semiconductor component, in which by absorption of incident electromagnetic radiation pairs of charge carriers are generated and subsequently separated at a pn-junction such that a potential develops between at least two electric contacting points of the solar cell and electric power can be tapped.

The pn-junction can be realized such that in a semiconductor substrate with a base doping, by way of diffusion of a doping substance of an emitter doping opposite the base doping, a respective emitter area is formed such that a pn-junction develops between the emitter area and the base-doped area of the semiconductor substrate.

It is also known to embody the emitter by applying one or more layers on a base substrate, particularly by applying an emitter layer made from amorphous silicon onto a base substrate comprising monocrystalline silicon. Here too, the emitter layer comprises a doping type opposite the one of the base so that a pn-junction develops between the emitter and the base. Due to the fact that the amorphous silicon layer of the emitter exhibits a band gap different from the crystalline silicon of the base, here a so-called hetero-pn junction forms so that a so-called hetero-emitter is given.

If the base substrate and the amorphous silicon layer have the same doping type, however different doping concentrations, a hetero-junction develops as well, in this case a so-called "high-low junction". Such a hetero-junction is used to form hetero-contacts:

Different physical types of contacting are also known for the contacting of semiconductor areas: typically a metallic contacting structure is applied directly or indirectly on the semiconductor area to be contacted. Here, particularly the formation of an ohmic contact and a Schottky-contact is known. MOS/MIS-contacts are also known as a particular embodiment of a hetero-contact. A particular embodiment of MOS-MIS contacts exhibits the following design: substrate/tunnel oxide doped poly-Si layer. Such types of contacts are known for semiconductors and described for example in Peter Warfel, *Physics of Solar Cells: From Principles to New Concepts*, 2005, Weinheim: Wiley-VCH. (hetero-contact: chapter 6.6, p. 127ff; Schottky-contact: chapter 6.7.1, p. 131f; MIS-contact: chapter 6.7.2, p. 132) and Sze, S. M., *Semiconductor devices: Physics and Technology*, 1985, New York: John Wiley & sons, (MOS-contact: chapter 5.4, p. 186; metal-semiconductor contact: chapter 5.1, p. 160ff.)

Hetero-junctions are classically called junctions of materials having different band gaps. However, hetero-contacts may also be formed with an arrangement of a tunnel layer between the semiconductor substrate and the hetero-junction layer, for example as a substrate/tunnel-oxide/silicon-containing layer and/or MIS-contacts as described above. The name "hetero-junction" is used in this application in a comprehensive sense. The "hetero"-features of the hetero-junction can therefore be based on different band gaps between the semiconductor substrate and the hetero-junction layer and/or between the tunnel layer and the hetero-junction layer.

The term "hetero-junction" comprises in this application, as mentioned at the outset, both junctions with layers of different doping types, particularly to form hetero-emitters, as well as junctions with layers of the same doping type, particularly for the formation of hetero-contacts.

Analogous to the definition introduced with regards to the emitters, in the present case any contacts not representing hetero-contacts are called homo-contacts.

Photovoltaic solar cells having a hetero-emitter and/or a hetero-contact, i.e. at least one hetero-junction, are called hetero-solar cells. Such hetero-solar cells are known from DE 10 2008 030 693 A1 and US 2012/0055547 A1, for example.

SUMMARY

The present invention is based on the objective of improving the methods of prior art for producing hetero-solar cells.

This objective is attained in a method according to the invention. Preferred embodiments of the method according to the invention are disclosed in the dependent claims, which are hereby explicitly included in the description by way of reference.

The method according to the invention for the production of a photovoltaic solar cell with at least one hetero-junction includes the following processing steps:

A semiconductor substrate with a base doping is provided in a processing step A.

In a processing step B, a hetero-junction is generated at least at one side of the semiconductor substrate. The hetero-junction is embodied by a doped hetero-junction layer and a dielectric tunnel layer arranged directly between the hetero-junction layer and the semiconductor substrate. The tunnel layer is preferably embodied in an undoped fashion (intrinsic).

In a processing step C the hetero-junction layer is heated in order to improve the electric quality of the hetero-junction.

It is known that in hetero-junctions with a dielectric tunnel layer the quality of the hetero-junction can be improved by way of activation using a heating process. The heating reduces the recombination of charge carriers so that ultimately with a heat-treated hetero-junction generally a higher open terminal voltage of the solar cells is yielded. Thus, in the processing step C a heating process occurs at least such that an effective surface recombination speed allocated to the hetero-junction is reduced, at least for the minority charge carriers at the side of the semiconductor substrate facing the hetero-junction.

It is essential that in a processing step D, after the processing step C, hydrogen is diffused into the hetero-junction layer and/or to the boundary between the tunnel layer and the semiconductor substrate.

The invention is based on the surprising finding that by adding the processing step D with the diffusing of hydrogen at least into the hetero-junction layer and/or the boundary between the tunnel layer and the semiconductor substrate, here considerable improvement is yielded to the methods of prior art for the production of a photovoltaic solar cell with at least one hetero-junction: By diffusing hydrogen as described above, on the one hand an increase of the open terminal voltage can be yielded in reference to prior art. Furthermore, in the processing step C a considerably wider range of parameters with regards to the heating of the hetero-junction layer is possible without here considerable reductions concerning the open terminal voltage being observed. A potentially only partial or disadvantageous activation of the hetero-junction layer in the processing step C is therefore compensated at least with regards to the open terminal voltage by the processing step D of the method according to the invention and furthermore even an overall increase of the open terminal voltage is possible in reference to methods of prior art.

The method according to the invention therefore allows wider process windows with regards to the parameters, such as temperature, temperature consistency, and duration of the heating process in the processing step C, but also with regards to material parameters regarding, e.g. the quality of the tunnel layer and/or the hetero-junction layer. With the method according to the invention therefor greater freedoms or tolerances are possible with regards to the processing and/or the solar cell is improved with regards to its open terminal voltage.

Another improvement of the open terminal voltage and/or expansion of the above-mentioned processing window is yielded by hydrogen further being diffused both at the boundary between the tunnel layer and the semiconductor substrate as well as into the hetero-junction layer in a preferred embodiment in the processing step D, after the processing step C.

The method according to the invention is particularly suited for the application of a carbon-containing silicon carbide layer (SiC-layer). Thus, in an advantageous embodiment in the processing step B the hetero-junction layer is embodied as a SiC-layer, particularly a doped SiC-layer.

The use of a SiC-layer as the hetero-junction layer is known per se and described in US 2012/0055547 A1. Compared to other hetero-junction layers of prior art, such as hetero-junction layers made from amorphous, hydrogenated silicon (a-Si:H), such a layer has the advantage that a greater temperature stability is given, so that greater freedom is also given with regards to the processing steps after the application of the hetero-junction layer, particularly with regards to the temperatures used.

Extensive experiments have shown that particularly such SiC-layers, for activating, i.e. for yielding sufficiently high electric quality for an open terminal voltage in the processing step C, require heating to high temperatures and furthermore the positive effects only occur in a narrow processing window, particularly a narrow temperature window.

By the method according to the invention it is possible to use a SiC-layer as a hetero-junction layer without it being required to comply with narrow processing windows of the method of prior art in the processing step C. Additionally, other hetero-junction layers are included within the scope of the invention, particularly the formation of the hetero-junction layer as an amorphous silicon layer (a-Si), amorphous silicon oxide layer (a-SiO$_x$), or amorphous silicon nitride layer (a-SiN$_x$). Here, the layer preferably has a silicon rate of at least 70%, particularly at least 80%. The scope of the invention also includes the formation of the hetero-junction layer as a polycrystalline silicon layer or an amorphous/microcrystalline/polycrystalline silicon carbide layer (a-SiC/μc-SiC/pc-SiC).

Additionally, the scope of the invention also includes embodying the hetero-junction layer as an intrinsic, n-doped, or p-doped one.

The greater band width of the temperatures beneficial and applicable in the processing step C during the heating process of the hetero-junction layer further allows a wider selection with regards to the embodiment of the dielectric tunnel layer. In particular the use of a silicon-oxide based tunnel layer, such as for example a SiO$_2$-tunnel layer, was critical in methods of prior art because such a tunnel layer is damaged at temperatures exceeding 900° C. so that the efficiency of the solar cell is reduced. In methods of prior art it is necessary, however, to activate the hetero-layer embodied as a SiC-layer at temperatures amounting to approximately 900° C. so that here considerable risk was given, particularly in combination with the use of tunnel layers based on silicon-oxide. In the method according to the invention however lower temperatures are possible in the processing step C as well, so that in turn a considerably lower risk is given for the use of other tunnel layers, such as a tunnel layer based on silicon-oxide or one of the layers HfO$_2$-layer, Al$_2$O$_3$-layer, AlN-layer, AlSiO$_x$-layer, HfSiO$_x$-layer.

In a preferred embodiment therefore in the processing step C heating occurs to a temperature below 900° C., preferably below 880° C., particularly preferred below 850° C., in order to avoid damaging the tunnel layer.

Experiments have shown that in the processing step C preferably heating occurs of at least the hetero-junction layer, preferably the entire solar cell to at least 600° C., preferably to at least 700° C. This leads to an advantageous increase of the open terminal voltage, particularly preferred in combination with the embodiment of the hetero-junction layer as a SiC-layer. The heating can occur via RTP (rapid thermal processing). Here, heating occurs preferably for a period of at least 3 s, preferably 10 s, preferably ranging from 3 s to 1 minute. Here, heating may also occur in a kiln, particularly a tube kiln. The heating occurs here preferably for a period of at least 10 minutes, preferably 60 minutes, particularly preferred ranging from 10 minutes to 120 minutes.

In particular when using a SiC-layer as the hetero-junction layer, with the method according to the invention a processing window is provided in the processing step C with regards to temperatures at least ranging from 600° C. to 900° C., preferably ranging from 700° C. to 880° C., in which a considerably increased open terminal voltage is yielded. This is particularly an improvement in reference to methods of prior art using a SiC-hetero-junction layer, which mandate a temperature of approximately 900° C.

As described above, in the processing step D, hydrogen is diffused at least into the hetero-junction layer and/or into the boundary between the tunnel layer and the semiconductor substrate. This occurs preferably by heating the solar cell to at least 350° C. Experiments have shown that starting at this temperature sufficiently high diffusion of hydrogen occurs. The heating occurs preferably at least for a period of 1 min, preferably 10 min, preferably 30 min.

Preferably, in the processing step D a heating process occurs to a temperature below 800° C., particularly below 600° C., in order to avoid compromising the electric quality of the layers of the solar cell. An activation and/or partial activation can already occur in the processing step C, so that preferably in the processing step D a temperature is selected below the activation temperature, preferably below 600° C.

In a preferred embodiment of the method according to the invention the hetero-junction layer is embodied as an amorphous silicon layer, particularly preferred as an amorphous silicon carbide layer (a-SiC). The amorphous character of a hetero-junction layer, particularly a doped SiC-layer, is advantageous for the efficiency of a hetero-contact. Therefore, preferably at least a partial, preferably a complete generation of the amorphous structure of the hetero-junction layer occurs in the processing steps C and D. In typical a-SiC layers the amorphous structure is yielded at least partially by abstaining from heating the hetero-junction layer above 850° C., particularly abstaining from heating above 700° C. Experiments have shown that particularly heating to a temperature ranging from 780° C. to 820° C., particularly to approximately 800° C. is advantageous with regards to the electric passivating effect.

Using the method according to the invention therefore allows for the first time, when forming the hetero-junction layer as a SiC-layer, to yield high electric quality of the hetero-junction and yet yielding an amorphous structure of the hetero-junction layer.

In this preferred embodiment it is particularly advantageous to form the hetero-junction layer as a doped hetero-junction layer because, based on the temperatures in the processing step C and D being below 800° C., preferably below 700° C., none or only minor diffusion of doping substances occurs from the hetero-junction layer into the semiconductor substrate. Accordingly, advantageously a so-called abrupt hetero-junction is formed (without diffusion input into the substrate). With abrupt hetero-junctions here most efficient solar cells have been formed, they represent therefore an advantageous embodiment for very high efficiency levels.

The provision of hydrogen in the processing step D for diffusing at least into the hetero-junction layer and/or the boundary between the tunnel layer and the semiconductor substrate can occur in different fashions:

In a preferred embodiment, in the processing step D, a tempering is performed in an atomic hydrogen atmosphere, particularly at a temperature of approximately 400° C.

In particular, hydrogen is preferably inserted in the processing step D via the remote plasma hydrogen passivation (RPHP)-method. The RPHP-method is known per se and described for example in S. Lindekugel, et al., "Plasma hydrogen passivation for crystalline silicon thin-films", in Proceedings of the 23$^{rd}$ European Photovoltaic Solar Energy Conference, Valencia, Spain, 2008, pp. 2232-5. This method is also known by the abbreviation MIRP (microwave induced remote plasma).

The use of this method offers the advantage that an efficient introduction of hydrogen is ensured in the processing step D and simultaneously heating to a temperature above 600° C. is not necessary so that particularly an amorphous structure of the hetero-junction layer can be obtained and none or only minor diffusion occurs of doping substances from the hetero-junction layer into the semiconductor substrate.

Alternatively or additionally, in the processing step D hydrogen can be introduced, in which in a preferred embodiment a hydrogenous layer is applied indirectly or preferably directly on the hetero-junction layer and subsequently hydrogen is introduced via heating, preferably to at least 350° C.

Here, the hydrogenous layer is therefore applied indirectly or preferably directly on the side of the hetero-junction layer facing away from the semiconductor substrate and diffused out of the hydrogenous layer into it by heating the hydrogen. Here, too the temperature in the processing step D may be below 600° C., particularly preferred below 500° C., in order to yield the above-mentioned advantages with regards to obtaining an amorphous structure of the hetero-junction layer and avoiding the diffusion of doping substances from the hetero-junction layer into the semiconductor substrate.

In a preferred embodiment the above-mentioned hydrogenous layer is embodied as a microcrystalline silicon layer, particularly a hydrogenated microcrystalline silicon carbide layer (µc-SiC:H). This leads to the advantage that this layer is more conductive and visually more transparent than for example an a-Si:H-layer. In particular, a µc-SiC-layer may serve advantageously as a transparent contacting and thus replace conductive transparent electrodes known per se, for example TCO-layers.

Additionally, the hydrogenous layer may be embodied as a silicon nitride layer, particularly a hydrogenated silicon nitride layer. Here, preferably heating occurs in the processing step D to a temperature ranging from 700° C. to 900° C., however only for a period of a few seconds, particularly from 1 second to 30 seconds, preferably from 1 second to 15 seconds. This way, in a particularly efficient fashion, hydrogen is diffused in a method requiring little time.

Based on the brief impingement with heat, any diffusion of doping substances is avoided or at least reduced.

Preferably, the processing step C occurs in a nitrogen atmosphere. This results in the advantage that the SiC-layer is not oxidized/changed. An oxidation of SiC would compromise both the conductivity as well as the ability for electric contacting.

Preferably, a metallic contacting layer is arranged indirectly or preferably directly on the hetero-junction layer, which is connected in an electrically conducting fashion to the hetero-junction layer in order to form contacts.

The method according to the invention further offers the advantage that now it is possible for the first time to activate the passivation of undoped hetero-junctions: This is caused in that in the processing step C the passivation is influenced by the diffusion of doping substances: Doping substances bond to open bonds and/or grain boundaries and this way reduce the number of defects. Furthermore, during the processing step C a doping profile is generated in the semiconductor substrate, which leads to a reduction of the density of minority charge carriers at the boundary semiconductor substrate/tunnel layer, however it also leads to less recombinations in the semiconductor substrate (Auger recombination). The formation of a doping profile in the semiconductor substrate is particularly advantageous when the quality of the tunnel layer cannot be ensured with regards to the passivation of the semiconductor substrate.

In a preferred embodiment of the method according to the invention, therefore the hetero-junction layer in the processing step B is embodied at least sectionally as an undoped hetero-junction layer.

It is particularly advantageous to form a plurality of alternating p-doped and n-doped sections in the hetero-junction layer, with the p-doped and n-doped sections each being generated spaced apart from each other such that respectively an undoped section of the hetero-junction layer is arranged between adjacent p-doped and n-doped sections.

The method according to the invention is therefore used advantageously to form photovoltaic contact cells at the back having the above-described embodiment:

Such photovoltaic solar cells typically comprise a semiconductor substrate embodied as a silicon substrate with a tunnel layer, arranged indirectly or directly at the rear of the semiconductor substrate, and a hetero-junction layer, arranged indirectly or directly on the tunnel layer, which is preferably embodied as a silicon layer, particularly as a SiC-layer described above. The hetero-junction layer comprises a plurality of alternating arranged p-doped and n-doped sections.

Photovoltaic rear contact cells are known per se and show both contacting polarities at the rear of the solar cell, facing away from incident light during use, so that a simple circuitry is possible in the module and particularly it is not necessary to arrange any metallic contacting structures at the front, so that shadowing loss by such metallic contacting structures is avoided because the metallic contacting structures of both polarities can be arranged on the rear.

The present advantageous embodiment therefore relates to a particular realization of such a rear contact cell, in which a tunnel layer is applied on the silicon substrate and a hetero-junction layer is indirectly or preferably directly applied on the tunnel layer with alternating arranged p-doped and n-doped areas.

Such rear contacting photovoltaic silicon solar cells show very high efficiency potentials, because as described above they show no shadowing on the front facing the incident light caused by metallic contract structures and at the rear the metallization can be optimized independent of any optic limitations. In case of rear contacting silicon solar cells known from prior art with emitters diffused into the semiconductor substrate, the recombination of charge carriers in this highly doped area is dominant, particularly in the areas provided with metal contacts, so that a doped emitter or a so-called BSF, i.e. a high doping of the base doping type represents a limitation of the open terminal voltage of the solar cell.

It is therefore known to increase the efficiency such that the emitter and the BSF are arranged at the rear of the solar cell, however they are separated from the substrate by a thin, dielectric tunnel layer; therefore a hetero-junction develops. This way dark saturation current density is reduced and thus comparatively higher open terminal voltages can be yielded. Such a solar cell is described for example in U.S. Pat. No. 7,468,485 B1.

For the production of such a solar cell it is known from the above-mentioned document as well as from US 2009/0308438 A1 and from US 2010/0139764 A1 to apply a polycrystalline silicon layer as the hetero-junction layer on the above-mentioned dielectric tunnel layer, subsequently to structure the polycrystalline silicon layer, and successively to apply sources for p-doped and n-doped doping substances. Furthermore, methods are known from WO 2012/039831 A1 for the production of such a solar cell structure.

The photovoltaic solar cell formed via an advantageous embodiment of the method therefore comprises preferably a semiconductor substrate with a tunnel layer indirectly or preferably directly arranged on the back of the semiconductor substrate and a hetero-junction layer indirectly or preferably directly arranged on the tunnel layer, which hetero-junction layer comprising a plurality of alternating arranged p-doped and n-doped areas.

With regards to this basic structure, the embodiment of this solar cell is therefore equivalent to the above described solar cell structures known from prior art. It is within the scope of the invention that the solar cell has additional common elements, such as comprising metallic contacting structures embodied for the electric contacting, on the one side of the p-doped areas and on the other side the n-doped areas, and/or other layers and/or structures embodied to increase efficiency, particularly for the electric passivation of surfaces, i.e. reducing the speed of surface recombination and/or increasing the incident light or the light absorption.

In this preferred embodiment it is essential that respectively an undoped area is arranged in the hetero-junction layer between the p-doped and the n-doped areas.

The preferred embodiment of the method according to the invention for implementing such a solar cell is based on the acknowledgement of the applicant that a considerable loss factor, which may lead to reduction of efficiency, occurs at the boundary between the p-doped and the n-doped areas: At this boundary, particularly the production methods known from prior art lead to increased recombination in the space charging zone forming at these boundaries.

For the first time, this solar cell now forms a solar cell structure which allows a cost-effective production and simultaneously avoids the above-mentioned loss. By the use of a continuous hetero-junction layer, which has an undoped area interposed respectively between a p-doped and a n-doped area, the formation of the above-mentioned space charging zone is avoided easily and in a cost-effective manner, and thus the efficiency of the solar cell is yielded, without any essential increase of the processing costs compared to methods of prior art and/or with a reduction of processing costs compared to these methods.

The advantage is given particularly in the surprising acknowledgement that by the interposed undoped areas of the hetero-junction layer on the one hand effectively the formation of such a space charging zone can be prevented, which otherwise leads to increase loss from recombination, and on the other hand no or only irrelevant loss in efficiency develops by the partial arrangement of the undoped areas in the hetero-junction layer. The complete, indirect or preferably direct covering of the tunnel layer by a p-doped or n-doped area is less relevant according to the knowhow of the applicant with regards to efficiency than the prevention or at least reduction of the above-mentioned loss by interposing the undoped areas respectively between a p-doped and an n-doped area of the hetero-junction layer.

Now for the first time the solar cell fulfills the requirements that a rear contacting silicon solar cell allows high open terminal voltage and simultaneously can be produced in a cost-effective fashion in reference to methods of prior art. These requirements could not be met with the structures of prior art and the production methods required, here, in spite of the great demand of such a solar cell structure for the industrial production.

By the above-mentioned preferred embodiment of the method according to the invention the embodiment of the above-described solar cell structure with high efficiency is particularly possible in that by the introduction of hydrogen in the processing step D another reduction of influence upon the efficiency of the solar cell occurs, particularly the open terminal voltage, by the undoped areas of the hetero-junction layer.

In order to form an efficient hetero-junction, preferably the tunnel layer is arranged directly on the semiconductor substrate and/or the hetero-junction layer directly on the tunnel layer, preferably both the tunnel layer directly on the semiconductor substrate as well as the hetero-junction layer directly on the tunnel layer.

Preferably every undoped area is formed laterally, i.e. in the direction parallel to the rear of the solar cell according to the invention, with a width ranging from 10 μm to 1000 μm, preferably ranging from 50 μm to 500 μm. The p-doped and n-doped areas are preferably embodied with a width ranging from 10 μm to 1000 μm, particularly ranging from 50 μm to 500 μm.

Preferably a metallic contacting layer is arranged on the hetero-junction layer, which contacting layer is embodied electrically conductive to the p-doped areas and the n-doped areas and interrupted at the undoped areas.

The contacting layer may be embodied as a multi-layer system and preferably comprises one or more layers made from one or more of the following materials: Ni, Ti, Cu, Al, Ag, or alloys thereof, such as for example AlSi, TiN.

A solar cell embodied in this fashion furthermore has the advantage that no contact formation occurs at the undoped areas of the hetero-junction layer. Therefore, in a simple and cost-effective fashion an electric contacting is possible, on the one side of the p-doped sections and on the other side the n-doped sections, by applying a metal layer, respectively interrupted in the surface area of the undoped sections. This way the p-doped and n-doped areas are completely covered by the metal layer without, as known from solar cell structures of prior art, the risk of a shunt being given, particularly short circuitry, by a faulty connection of a metallic contacting with an oppositely doped section of the hetero-junction layer.

The preferred embodiment of the method therefore allows, also with regards to the electric contacting of the p-doped and the n-doped areas, a simplified processing via a metal layer and thus cost savings, while simultaneously the risk of shunts minimizing efficiency being eliminated or at least reduced.

It is within the scope of the invention that the metallic contacting layer is applied indirectly or directly on the hetero-junction layer. Due to the above-mentioned "automatic" separation caused by the lack of contacting between the metallic contacting layer and the undoped areas of the hetero-junction layer, particularly with regards to a cost-saving production process, preferably the metallic contacting layer can be applied directly on the hetero-junction layer.

Additionally, the interposition of one or more layers between the metallic contacting layer and the hetero-junction layer is within the scope of the invention, for example in order to improve the optic quality, particularly the reflective features of the rear of the solar cell. Preferably the metallic contacting layer is embodied locally penetrating the above-mentioned interposed layers in order to generate the electric contact to the n-doped areas and/or p-doped areas located underneath thereof. However, contrary to the solar cell arrangements of prior art it is not necessary for one or perhaps several interposed layers to show high safety with regards to electric isolation.

In the solar cell structures of prior art there is always the risk that any metallization projecting beyond the boundary of the allocated doping area, for example by so-called spiking, also contacts the oppositely doped area through the interposed layer and this way the above-mentioned shunts develop with the corresponding loss in efficiency.

In the solar cell structure described above, however, a "buffer" is generated by the interposed undoped areas, in which as described above the metallic contacting layer cannot form an electric contact so that even in areas in which the metallic contacting layer projects beyond the allocated doped area, no loss of efficiency develops because in such a projecting area the metallic contacting layer only covers an undoped area in which no electric contact forms. In the preferred embodiment with one or more interposed layers between the semiconductor substrate and the metallic contacting layer therefore an optimization can occur with regards to other features, particularly with regards to an improvement of the optical quality, without here an embodiment of this layer for interrupting any spiking must be considered.

In a preferred embodiment therefore at least one dielectric layer is arranged between the hetero-junction layer and the contacting layer, showing a diffraction index ranging from 1 to 3 at least in the wavelength range from 800 nm to 1200 nm so that the optic quality of the back of the solar cell and thus the light absorption in the solar cell and ultimately the efficiency are increased. Here it is particularly advantageous that the dielectric layer covers the silicon over the entire area and only locally sections are penetrated by the metallic contacting layer for contacting the n-doped and p-doped areas.

The hetero-junction layer may be embodied in a manner known per se. In particular, the embodiment of the hetero-junction layer as a polycrystalline, micromorphous, or amorphous hetero-junction layer is within the scope of the invention. The hetero-junction layer may be embodied as a polycrystalline Si-layer. This results in the advantage that it shows a considerably higher electric conductivity.

With the method according to the invention a solar cell is produced in a simple and cost-effective fashion, which exhibits the above-mentioned advantages.

In particular, it is advantageous to generate the n-doped and p-doped areas via ion-implantation, particularly directional ion implantation. This way, in a cost-effective fashion and without any expensive application of potential layers comprising doping substances as the source for doping substance via the ion implantation the desired structure of p-doped and n-doped areas and interposed undoped areas can be created.

Here a particularly simple and cost-effective production is possible by generating the p-doped and/or n-doped areas, preferably also the p-doped as well as the n-doped areas using a shadow mask.

In an alternative embodiment of the method according to the invention the p-doped and/or n-doped areas are generated via a lacquer mask. For this purpose, the lacquer mask is respectively applied in the areas in which no doping shall occur. For example, first a lacquer mask can be applied which only exempts the p-doped areas and subsequently an appropriate doping occurs via ion implants, with the lacquer mask serving as a barrier for the ions. Accordingly, the lacquer mask is then removed. An application of another lacquer mask occurs, which exempts the n-doped areas to be generated.

Here, the application of pastes via offset printing or an inkjet method, known per se, is particularly cost-effective.

Preferably a metallic contacting layer is applied directly on the hetero-junction layer. This way a cost-effective method results, and as described above no risk develops for the formation of a shunt because the metallic contacting layer forms no electric contact to the undoped hetero-junction layer. For the separate contacting of the p-doped areas and the n-doped areas on the other side the metallic contacting layer is embodied in an interrupted fashion at the undoped areas, as described above.

Preferably, after the processing step D, in a processing step E' a dielectric layer is applied on the hetero-junction layer and in a processing step E'' a metallic contacting layer is applied on the dielectric layer. This way, as described above, particularly the optic quality of the back of the solar cell can be increased. Preferably, the dielectric layer is therefore applied on the hetero-junction layer in a completely covering fashion and the contacting layer is applied such that it only penetrates locally the dielectric layer in order to form an electric contact to the respectively allocated p-doped or n-doped area. The local opening of the dielectric layer can occur via methods known per se, such as laser ablation or local application of etching pastes.

In order to increase the optic quality the above-mentioned dielectric layer is preferably formed with a diffraction index ranging from 1 to 3 at least in the wavelength range from 800 nm to 1200 nm.

The thickness of the above-mentioned dielectric layer ranges preferably from 50 nm to 1000 nm, particularly preferred from 70 nm to 400 nm.

Preferably, the dielectric layer is respectively opened locally between the processing step E' and E" at every p-doped and every n-doped area, in order to allow electric contacting of the respectively allocated doped areas with high quality when the metallic contacting layer are penetrated.

In order to form the interrupted metallic contacting layer at the undoped areas it is advantageous for yielding a cost-effective and inexpensive production method that the contacting layer is removed at every undoped area located between a p-doped and n-doped area. This can occur in turn by methods known per se, such as laser ablation or local application of etching media.

Preferably the hetero-junction layer is embodied as a carbonated SiC-layer. This way the advantage develops that by the use of a carbonated SiC-layer on the one hand the band gap and thus also the optic features can be changed. Furthermore it is known that SiC is suitable as a barrier for copper migration and an oxidation of the layer is suppressed when entering the high-temperature step.

Preferably the metallic contacting layer comprises copper, particularly preferred embodied as a copper layer. This results in the advantage that the conductivity of copper is similar to that of silver, however it is considerably less expensive.

It is within the scope of the invention that several, particularly two separate metallic contacting structures are arranged at the back of the solar cell according to the invention so that, as common in the rear contact sites of prior art, a metallic contacting structure electrically contacts the p-doped areas and the other metallic contacting structure electrically contacts the n-doped areas and the two metallic contacting structures can be electrically connected accordingly to an external circuit or adjacent solar cells in a modular circuitry.

It is particularly within the scope of the invention that the metallic contacting structure for the p-doped areas is applied in a separate processing step from the application of the metallic contacting structure for the n-doped areas and/or that for the first-mentioned contacting structure a different metal is used in reference to the second-mentioned contacting structure. In order to contact the p-doped areas particularly one or more of the metals Cr, N, Al, Ag, Si, Ti may be used. For contacting the n-doped areas particularly one or more of the metals Cr, Ni, Al, Ag, Si, Ti may be used.

However it is particularly advantageous, as mentioned above, to arrange a metallic contacting layer, which is connected in an electrically conductive fashion to the p-doped areas and the n-doped areas and is embodied interrupted at the undoped areas. Here too, a metallic contacting structure is formed for the p-doped areas, which based on the interruption at the undoped areas is embodied electrically isolated from the metallic contacting structure of the n-doped areas. By the production of these two metallic contacting structures, starting from a metallic contacting layer, however a particularly simple and cost-effective production process is given. In this preferred embodiment respective p-doped and n-doped areas are contacted with the same metallic layer. In order to contact both doping types preferably one of the metals Al, AlSi, Ni, Ag is used.

The semiconductor substrate is preferably embodied as a silicon substrate, particularly a silicon wafer, particularly preferred a monocrystalline silicon wafer. The embodiment of the silicon substrate as a multi-crystalline silicon wafer is also included in the scope of the invention.

The thickness of the semiconductor substrate ranges preferably from 10 µm to 300 µm.

The thickness of the tunnel layer ranges preferably from 0.5 nm to 3 nm.

The p-doped or n-doped areas are preferably embodied as oblong, parallel extending areas, which extend approximately over the entire width of the silicon wafer. Accordingly, the undoped areas interposed are also preferably embodied as oblong areas extending parallel to the p-doped and n-doped areas. The formation of so-called spot-doping is also included in the scope of the invention.

The tunnel layer is preferably embodied from $SiO_2$.

Preferably the n-doped areas are generated via ion-implantation with the use of phosphorous and the p-doped areas via ion implantation with the use of boron.

The semiconductor substrate preferably has a base doping of a base doping type ranging from $10^{10}$-$10^{16}$ cm$^{-3}$. Preferably the base is n-doped and accordingly oppositely doped, i.e. p-doped areas of the hetero-junction layer are emitter areas of the doping type. Additionally, the inverse selection of the doping types is within the scope of the invention, i.e. embodying the solar cell with a p-doping as the base doping type and an n-doping as the emitter doping type.

The areas of the hetero-junction layer exhibiting the base doping type are preferably embodied with a doping ranging from $10^{18}$ cm$^{-1}$ to $10^{21}$ cm$^{-3}$. The areas of the hetero-junction layer exhibiting the emitter doping type are preferably embodied with a doping ranging from $10^{18}$ cm$^{-3}$ to $10^{21}$ cm$^{-3}$.

BRIEF DESCRIPTION OF THE DRAWINGS

Additional preferred features and embodiments are explained in the following based on exemplary embodiments and the figures.

Here, the FIGS. 1 to 5 show an exemplary embodiment of a method according to the invention for the production of a photovoltaic solar cell, with the FIGS. 5a to 5b illustrating alternatives for the embodiment of metallic contacting structures.

The figures respectively show schematic cross-sections, with for better visibility details being shown, i.e. the solar cell and/or its precursor continues analogously at the right and the left. In the figures identical reference characters indicate identical or equivalent elements.

DETAILED DESCRIPTION OF THE PREFERRED EMBODIMENTS

Figure 1:
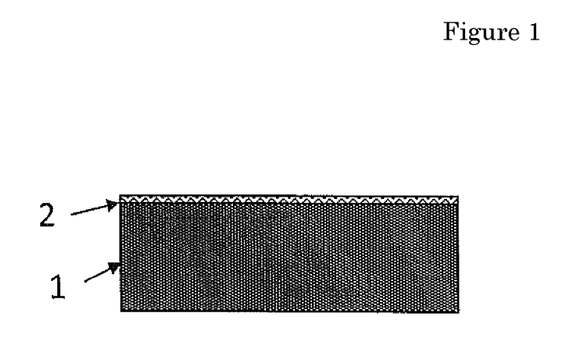

In the exemplary embodiment of a method according to the invention shown in the figures, according to FIG. 1 a tunnel layer 2 is applied onto the semiconductor substrate 1 embodied as a silicon substrate. The semiconductor substrate 1 is embodied as a monocrystalline silicon wafer. The tunnel layer 2 has a thickness ranging from 5 Angstrom to 30 Angstrom, preferably amounting to 10 Angstrom. It is embodied as a silicon dioxide layer. Similarly, the tunnel layer can be embodied as a different oxide.

The tunnel layer is applied via wet-chemical growth. Additionally the tunnel layer can be deposited via RTO (rapid thermal oxidation), ALD (atomic layer deposition), PECVD (plasma enhanced chemical vapor deposition), LPCVD (low pressure chemical vapor deposition), or APCVD (atmospheric pressure chemical vapor deposition).

FIG. 1 therefore shows the state in which the tunnel layer was directly applied on the rear of the semiconductor substrate 1 (shown on top in the FIGS. 1 to 5).

Figure 2:
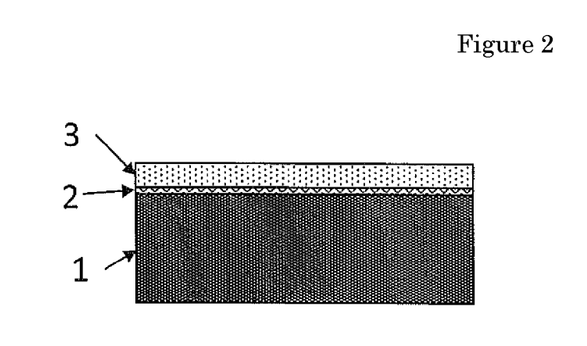

In another processing step according to FIG. 2 an undoped hetero-junction layer 3 is applied. The hetero-junction layer 3 may be embodied as a micromorphous, amorphous, or polycrystalline hetero-junction layer.

The thickness of the hetero-junction layer ranges from 10 nm to 1000 nm, and preferably amounts to approximately 30 nm. The hetero-junction layer is applied via PECVD. Additionally, the application of the hetero-junction layer 3 by way of LPCVD or APCVD or sputtering is also within the scope of the invention.

FIG. 2 shows therefore the state in which the undoped hetero-junction layer 3 was applied directly upon the tunnel layer 2.

In order to increase the doping efficiency of a subsequent implantation step the polycrystalline hetero-junction layer 3 is preferably embodied as large grains. The grains of the polycrystalline hetero-junction layer 3 have preferably on average a diameter exceeding 1 µm, preferably exceeding 5 µm. The formation of a polycrystalline hetero-junction layer with such grain sizes is known per se and described, e.g., in US 2010/0139764 A1, particularly paragraph [0023].

Figure 3:
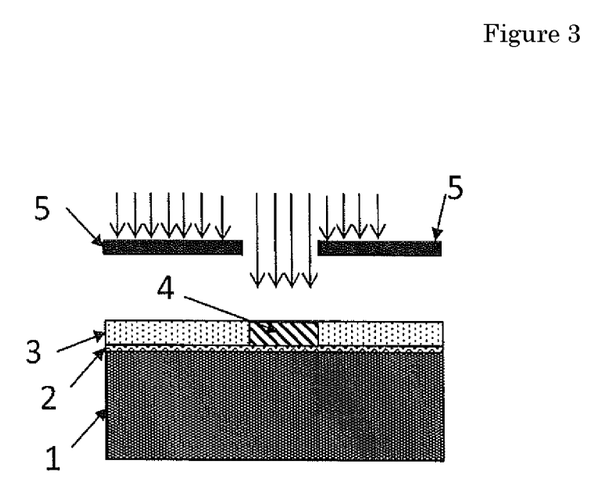

In another processing step according to FIG. 3 a local doping occurs of the previously undoped polycrystalline hetero-junction layer 3 with a doping of an emitter doping type. The emitter doping type is opposite the base doping type. In the present case, the semiconductor substrate 1 is n-doped. The base doping is therefore an n-doping and accordingly the emitter doping is a p-doping. Additionally, the scope of the invention includes selecting opposite doping types, i.e. a p-doped base and a n-doped emitter.

In the processing step according to FIG. 3, therefore p-doped areas are formed, with for example a p-doped area 4 being shown. For this purpose a shadow mask 5 is used, which is arranged distanced from the hetero-junction layer 3. The arrows in FIG. 3 show schematically the ion beam, which due to the shadow mask impinges the hetero-junction layer 3 only in those areas, in which the n-doped area 4 shall be generated via ion-implants. It is also within the scope of the invention to apply a lacquer mask instead of a shadow mask 5 on the hetero-junction layer 3, particularly preferred via offset printing or an inkjet method.

Subsequently, in a processing step according to FIG. 4, n-doped areas are generated via ion-implantation. For better visibility, in FIG. 4 only two n-doped areas 6 and 6' are shown.

The generation of the p-doped areas occurs similarly to the process according to FIG. 3: Via a shadow mask 5' the hetero-junction layer 3 is covered with regards to the ion flow, with only those areas remaining exempt in which the p-doped areas 6, 6' shall be generated.

The n-doped areas therefore have the base doping type, however they are higher doped than the base: The doping of the n-doped areas ranges here from $10^{18}$ cm$^{-3}$ to $10^{21}$ cm$^{-3}$.

Figure 4:
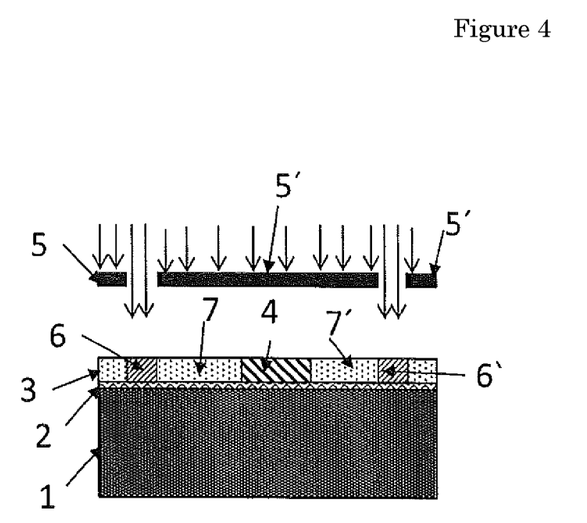

FIG. 4 therefore illustrates the status in which a plurality of alternating arranged p-doped and n-doped areas is generated in the hetero-junction layer.

Subsequently a heating of the solar cell occurs (not shown) in a processing step C. This way, activating the doping and crystallizing the polycrystalline hetero-junction layer 3 is yielded. The heating therefore represents a high-temperature step known per se, preferably with temperature ranging from 600° C. to 900° C., in the present case amounting to approx. 850° C. The high temperature step is performed in a tube kiln for a period of approx. 60 minutes.

Here, the high temperature step may also be performed as a RTP-step or with the use of a laser. In this high temperature step the doping substance may diffuse within the hetero-junction layer 3 so that the p-doped areas 4 and the n-doped areas 6, 6' are completely filled with the doping substance. However it is essential that respectively one undoped area 7, 7' is located interposed between the n-doped areas and the p-doped areas.

In the high temperature step the doping substance can slightly diffuse through the tunnel layer 2 without this noticeably changing the effectiveness of the solar cell. In case of a poor quality tunnel layer, here an improvement of the effectiveness is even possible.

Subsequently, (not shown) according to the processing step D hydrogen is diffused into the hetero-junction layer 3 and the boundary between the tunnel layer 2 and the semiconductor substrate 1, in the present case by heating to 400° C. for a period of at least 1 minute, preferably 10 min, preferably 30 min in a strongly hydrogenous atmosphere (approx. 70% $H_2$, which is ionized via a MW-plasma).

The exemplary embodiment of a method according to the invention as shown in FIGS. 1-4 show particularly the advantage that the area portion between the emitter (p-doped areas 4) and BSF (back surface field),i.e. n-doped areas 6, 6', and the undoped areas 7, 7' at the back of the solar cell, i.e. within the hetero-junction layer 3 can be freely selected and is predetermined in a simple fashion by the embodiment of the shadow masks 5 and 5'. In the method described, therefore the undoped areas 7 and 7' respectively separate the adjacent high-doped areas 4, 5, 5' so that the charge carrier—recombination is reduced.

Furthermore, the structure formed with the undoped areas 7, 7' shows another essential advantage in the subsequent metallization: Since silicon can only be electrically contacted when the surface concentration of the charge carriers in silicon exceeds a minimum value. A metal/silicon boundary to the undoped silicon leads to a very high contact resistance and therefore, with regards to a practical application, no electrically conductive contact develops. For example, if the entire back of the hetero-junction layer 3 is vapor deposited with a metal layer, here electrically conductive contacts only form in the highly p-doped areas 4 and the n-doped areas 6 and 6', however not in the undoped areas 7 and 7'.

Figure 5A:
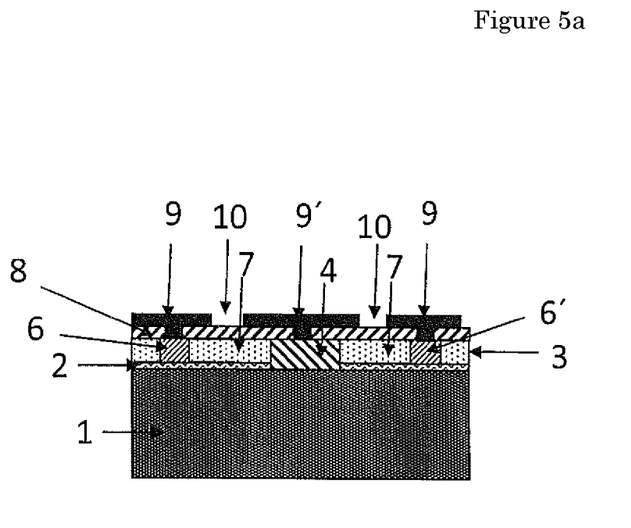

With regards to the metallization, i.e. the formation of metallic contact structures for the electric contacting of the p-doped areas 4, on the one side, and the n-doped areas 6, 6' on the other side, therefore different processing steps can be selected, with two versions from a plurality of alternatives being described in the following in FIGS. 5a and 5b:

According to FIG. 5a, initially a dielectric layer 8 is applied with a thickness ranging from 10 nm to 1000 nm, preferably 70 nm to 400 nm, in the present case amounting to approx. 100 nm on the hetero-junction layer 3. This dielectric layer 8 is locally opened in the p-doped areas 4 and the n-doped areas 6 and 6' (e.g., via laser ablation or local etching processes).

The dielectric layer 8 fulfills particularly two functions:

When the dielectric layer 8 is embodied with a diffraction index 1-3 (at least in the wavelength range between 800 nm and 1200 nm), i.e. the diffraction index is below the diffraction index of the semiconductor substrate 1, so that the photons penetrate from the front (seen in the figures at the bottom) into the semiconductor substrate, however they are not absorbed at a first penetration and thus reach via the tunnel layer 2 and the hetero-junction layer 3 to the dielectric layer 8, and are reflected back into the semiconductor substrate 1. The dielectric layer 8 therefore acts as an optic mirror for such photons so that the probability for absorption and thus the effectiveness of the solar cell is increased.

In the event that copper is used for the subsequent metallization, the dielectric layer 8 is additionally embodied as a diffusion barrier, so that any diffusion of copper into the semiconductor and/or into the undoped areas 7, 7' of the hetero-junction layer 3 is prevented, which would be disadvantageous for the effectiveness.

Based on the particular embodiment and arrangement of the undoped and doped areas in the hetero-junction layer 3 via the method it is however not necessary that the dielectric layer is electrically passivating, because the passivation of the back of the semiconductor substrate 1 occurs via the tunnel layer 2. Furthermore, the dielectric layer 8 may have small interruptions, so-called pinholes, because as described above the undoped areas 7 and 7' form no electric contact to a metallic layer.

Since the above-mentioned conditions of the electric passivation and the avoidance of the pinholes not necessarily need to be fulfilled, the method described therefore offers the advantage that compared to methods of prior art a greater selection is available with regards to the embodiment of the dielectric layer 8. In particular, the dielectric layer 8 may comprise silicon nitride, silicon oxide, titanium oxide, magnesium fluoride, aluminum nitride, or aluminum oxide. Due to the lower requirements, here a wider selection is also available for processing steps and/or methods of application for generating the dielectric layer 8.

As further shown in FIG. 5a, after the application of the dielectric layer 8 and the local opening of this dielectric layer 8 here a metallic contacting layer 9, 9' is applied, e.g., by way of vapor deposition. Subsequently the contacting layer 9, 9' is locally removed again in the areas 10, so that the contacting layer 9, 9' is embodied interrupted in the undoped areas 7, 7'. This local removal occurs via laser ablation or local etching processes. Additionally, the contacting layer 9, 9' can be removed locally via a lift-off process known per se.

Therefore a first metallic contacting structure is yielded comprising the areas 9 of the contacting layer, which electrically contacts the n-doped areas 6. Furthermore, a second metallic contacting structure develops comprising the areas 9' of the contacting layer, which electrically contacts the p-doped areas 4, with the contacting structures respectively touching and electrically contacting the doped areas positioned underneath at the areas, at which the dielectric layer 8 was removed.

FIG. 5a therefore represents the status after the performance of the processing step E', in which the dielectric layer 8 is applied on the hetero-junction layer 3 and after a processing step E'', in which the metallic contacting layer 9, 9' is applied on the dielectric layer 8.

Figure 5B:
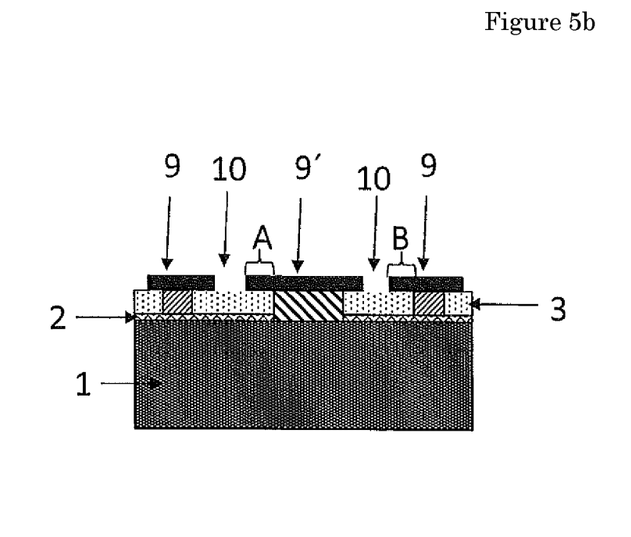

FIG. 5b shows another variant for the formation of the electric contacting structures. Contrary to FIG. 5a, no dielectric layer is applied but only a metal layer 9, 9' is precipitated over the entire area and subsequently via laser ablation or local etching processes removed again in the areas 10. Therefore a comparatively cost-effective embodiment of metallic contacting structures is yielded similar to FIG. 5a, with the exception that no dielectric layer is interposed between the contacting layer 9, 9' and the hetero-junction layer 3. The metal layer is applied via vapor deposition. In particular in this variant the advantage is given that in overlapping areas (two overlapping areas A and B are indicated in FIG. 5b as an example), in which the metal layer after structuring extends beyond the doped areas, no electric contact occurs to the undoped hetero-junction layer 3 located underneath. The metallization according to FIG. 5b therefore represents a particularly simple and cost-effective production variant. FIG. 5b shows therefore the status after the execution of the processing step E, in which a metallic contacting layer 9, 9' is directly applied on the hetero-junction layer 3, which contacting layer was locally removed in the areas 10.

If the metallization in the variant occurs according to FIG. 5b it is advantageous to embody the polycrystalline hetero-junction layer 3 not as a pure hetero-junction layer but for example as a carbonated SiC-layer. By the addition of carbon for example the band gap of the polycrystalline hetero-junction layer 3 can be enlarged and thus also its diffraction index, at least in the wavelength range from 800 nm to 1200 nm, can be reduced as well so that an efficient optic reflector is embodied with the above-mentioned advantages. Furthermore, the diffusion of copper in SiC is considerably lower than in silicon so that any migration of copper into the space charging zone of the pn-junction of the solar cell is prevented.

The contacting layer 9, 9' is initially applied over the entire area according to FIG. 5b and subsequently structured. Similarly, the dielectric layer 8 and the contacting layer 9, 9' according to FIG. 5a are initially applied over the entire area and subsequently respectively structured.

FIGS. 5a and 5b therefore each show a solar cell which, as described above, comprises the semiconductor substrate 1 with a tunnel layer 2 arranged directly on a back (shown above) of the semiconductor substrate 1 and a hetero-junction layer 3 directly arranged on the tunnel layer 2. The hetero-junction layer 3 comprises a plurality of alternating arranged n-doped (6, 6') and p-doped (4) areas. It is essential that one undoped area (7, 7') each is arranged in the hetero-junction layer 3 between the n-doped areas (6, 6') and p-doped areas (4).

The solar cell embodied in this fashion preferably comprises a continuous hetero-junction layer 3, i.e. preferably a hetero-junction layer 3 essentially extending uninterrupted over the entire back of the solar cell. This way the rear surface of the semiconductor substrate 1 is continuously electrically passivated (i.e. the surface recombination speed is low) and protected from contamination and other negative influences. Furthermore it is advantageous that the metallization 9, 9' is given in one level and shows no gradual offset so that any problems are avoided caused by such steps for the circuitry of the solar cells and/or connection to an external circuit or adjacent solar cells in a solar cell module.

Figure 6:
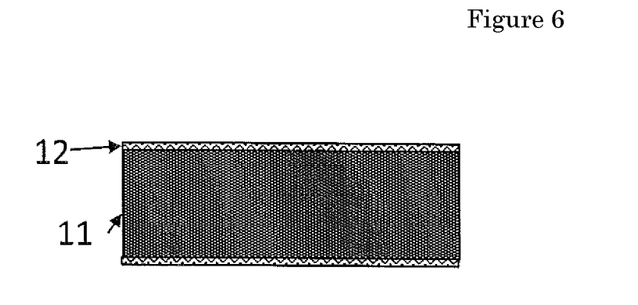
FIGS. 6 to 9 show another exemplary embodiment of a method according to the invention, with a homogenously doped hetero-junction layer being formed.

In the additional exemplary embodiment shown in FIGS. 6 to 9 of a method according to the invention, here according to FIG. 6, a tunnel layer 12 is applied on a semiconductor substrate 11 embodied as a silicon substrate. The semiconductor substrate 11 is embodied as a monocrystalline silicon wafer. The tunnel layer 12 has a thickness ranging from 5 Angstrom to 30 Angstrom, preferably 10 Angstrom. It is embodied as a silicon dioxide layer. Similarly, the tunnel layer may be embodied as a different oxide.

The tunnel layer is applied via wet-chemical growth. The tunnel layer may also be deposited via RTO (rapid thermal oxidation) or ALD (atomic layer deposition), PECVD, LPCVD, or APCVD.

FIG. 6 shows therefore the state in which the tunnel layer was applied directly on the front and back of the semiconductor substrate 11.

Figure 7:
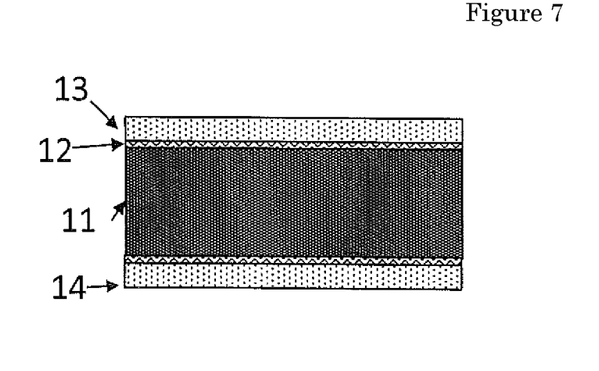

In another processing step according to FIG. 7 a n-doped hetero-junction layer 13 and subsequently a p-doped hetero-junction layer 14 are applied. The hetero-junction layers 13 may be embodied as micromorphous, amorphous, or polycrystalline hetero-junction layers. Optionally, the layer 13 may also be p-doped and the layer 14 may be n-doped. The deposition of intrinsic layers and the subsequent implantation of boron and/or phosphorous is possible as well.

The thickness of the hetero-junction layer ranges from 10 nm to 1000 nm, and preferably amounts to approx. 30 nm. The hetero-junction layer is applied via PECVD. The scope of the invention also includes the application of the hetero-junction layers 13 and 14 via LPCVD or APCVD or sputtering. The use of the methods LPCVD and/or APCVD is unavoidable in case of deposition on both sides and thus it is particularly advantageous to deposit an undoped layer and to subsequently dope it via ion implantation.

Subsequently (not shown) the solar cell is heated in a processing step C. This way an activation of the doping and crystallization of the hetero-junction layers 13 and 14 can be yielded. The heating therefore represents a high temperature step known per se, preferably with temperatures ranging from 600 to 900° C. The high temperature step is performed in a tube kiln. The high temperature step may also be performed as a RTP-step or via a laser.

In the high temperature step the doping substance may slightly diffuse through the tunnel layer 12 without this noticeably changing the efficiency of the solar cell.

Subsequently, in a processing step D, the hydrogen passivation (not shown) occurs in order to improve the passivation features.

Figure 8:
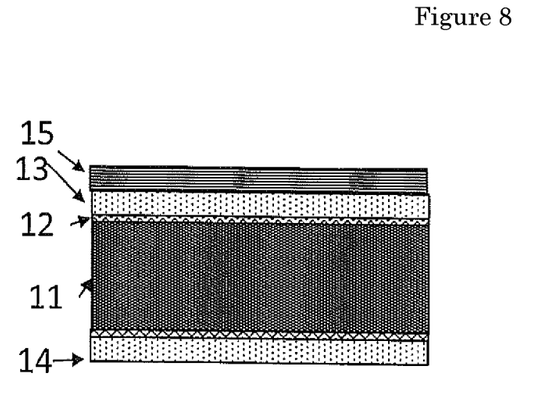

In another processing step according to FIG. 8 a TCO-layer 15 is applied. This TCO-layer serves for the generation of a lateral conductivity as well as for the better coupling of incident light. This layer 15 may be embodied as ITO, AZO, IO:H and has a thickness of approx. 70 nm. Optionally the layer 15 may represent not a TCO but a μc-SIC:H layer. This offers the above-mentioned advantage that it provides hydrogen, ensures a certain lateral conductivity, and exhibits low absorption. However, the quality of this layer is not comparable to one of TCO.

Figure 9:
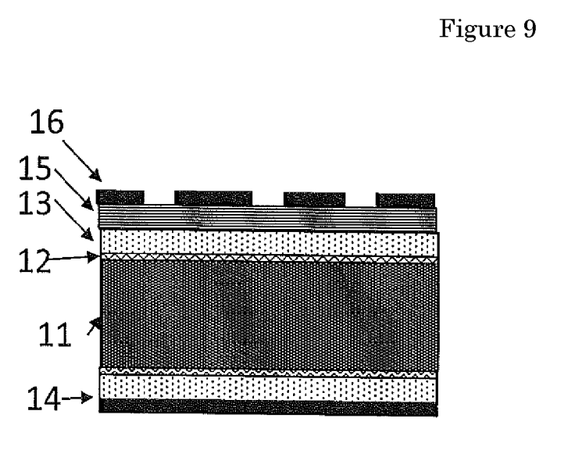

In another processing step according to FIG. 9 a metallic layer 16 is applied at the front in the form of a contacting grid and at the rear as a metallic layer covering the entire area.

The invention claimed is:

1. A method for production of a photovoltaic solar cell with at least one hetero-junction comprising the following steps:
A providing a semiconductor substrate with a base doping;
B generating a hetero-junction at least on one side of the semiconductor substrate, said hetero-junction having a doped hetero-junction layer and a dielectric tunnel layer arranged directly between the hetero-junction layer and the semiconductor substrate;
C heating at least the hetero-junction layer for improving an electric quality of the hetero-junction; and
D after the processing step C, diffusing hydrogen into at least one of the hetero-junction layer or a boundary between the tunnel layer and the semiconductor substrate,
wherein in the processing step D, after the processing step C, hydrogen is diffused both to the boundary between the tunnel layer and the semiconductor substrate as well as into the hetero-junction layer.

2. The method according to claim 1, wherein the hetero-junction layer is embodied as a layer comprising silicon.

3. The method according to claim 1, wherein the hetero-junction layer is embodied as a carbonated SiC-layer.

4. The method according to claim 1, wherein heating occurs in the processing step C of at least the hetero-junction layer to at least 600° C.

5. The method according to claim 1, further comprising in processing step D, heating the solar cell to at least 350° C.

6. The method according to claim 1, wherein the hetero-junction layer is formed in the processing step B as an amorphous silicon-containing layer and in the processing steps C and D the amorphous structure of the hetero-junction layer is yielded by abstaining from heating the hetero-junction layer beyond 800° C.

7. The method according to claim 1, wherein the processing step C is performed in a nitrogen atmosphere.

8. A method for production of a photovoltaic solar cell with at least one hetero-junction comprising the following steps:
A providing a semiconductor substrate with a base doping;
B generating a hetero-junction at least on one side of the semiconductor substrate, said hetero-junction having a doped hetero-junction layer and a dielectric tunnel layer arranged directly between the hetero-junction layer and the semiconductor substrate;
C heating at least the hetero-junction layer for improving an electric quality of the hetero-junction; and
D after the processing step C, diffusing hydrogen into at least one of the hetero-junction layer or a boundary between the tunnel layer and the semiconductor substrate,
wherein in the processing steps C and D diffusion of doping material from the hetero-junction layer into the semiconductor substrate is avoided by abstaining from heating the hetero-junction layer to more than 800° C.

9. A method for production of a photovoltaic solar cell with at least one hetero-junction comprising the following steps:
A providing a semiconductor substrate with a base doping;
B generating a hetero-junction at least on one side of the semiconductor substrate, said hetero-junction having a doped hetero-junction layer and a dielectric tunnel layer arranged directly between the hetero-junction layer and the semiconductor substrate;
C heating at least the hetero-junction layer for improving an electric quality of the hetero-junction; and
D after the processing step C, diffusing hydrogen into at least one of the hetero-junction layer or a boundary between the tunnel layer and the semiconductor substrate,
wherein in the processing step D the hydrogen is introduced via RPHP.

10. A method for production of a photovoltaic solar cell with at least one hetero-junction comprising the following steps:
A providing a semiconductor substrate with a base doping;
B generating a hetero-junction at least on one side of the semiconductor substrate, said hetero-junction having a doped hetero-junction layer and a dielectric tunnel layer arranged directly between the hetero-junction layer and the semiconductor substrate;
C heating at least the hetero-junction layer for improving an electric quality of the hetero-junction; and
D after the processing step C, diffusing hydrogen into at least one of the hetero-junction layer or a boundary between the tunnel layer and the semiconductor substrate, wherein the hydrogen is introduced by a hydrogenous layer being applied at least indirectly onto the hetero-junction layer and subsequently the hydrogen is introduced via heating.

11. The method according to claim 10, wherein the hydrogenous layer is embodied as a microcrystalline silicon layer.

12. The method according to claim 10, wherein the hydrogenous layer is embodied as a silicon nitride layer.

13. A method for production of a photovoltaic solar cell with at least one hetero-junction comprising the following steps:
- A providing a semiconductor substrate with a base doping;
- B generating a hetero-junction at least on one side of the semiconductor substrate, said hetero-junction having a doped hetero-junction layer and a dielectric tunnel layer arranged directly between the hetero-junction layer and the semiconductor substrate;
- C heating at least the hetero-junction layer for improving an electric quality of the hetero-junction; and
- D after the processing step C, diffusing hydrogen into at least one of the hetero-junction layer or a boundary between the tunnel layer and the semiconductor substrate, wherein in the processing step D the hydrogen is introduced via RPHP and a heating process occurs to a temperature ranging from 700° C. to 900° C. for a period from 0.5 s to 20 s.

14. A method for production of a photovoltaic solar cell with at least one hetero-junction comprising the following steps:
- A providing a semiconductor substrate with a base doping;
- B generating a hetero-junction at least on one side of the semiconductor substrate, said hetero-junction having a doped hetero-junction layer and a dielectric tunnel layer arranged directly between the hetero-junction layer and the semiconductor substrate;
- C heating at least the hetero-junction layer for improving an electric quality of the hetero-junction; and
- D after the processing step C, diffusing hydrogen into at least one of the hetero-junction layer or a boundary between the tunnel layer and the semiconductor substrate, wherein a plurality of alternating arranged p-doped and n-doped areas is formed in the hetero-junction layer, with the p-doped and n-doped areas being generated spaced apart from each other such that a non-doped area of the hetero-junction layer is respectively arranged between adjacent ones of the p-doped and n-doped areas.

* * * * *